United States Patent [19]

Wada et al.

[11] Patent Number: 4,737,884
[45] Date of Patent: Apr. 12, 1988

[54] SEMICONDUCTOR DEVICE MODULE

[75] Inventors: Kensaku Wada, Fujisawa; Hidehiko Akasaki, Aizuwakamatsu, both of Japan

[73] Assignee: Fujitsu Limited, Kawasaki, Japan

[21] Appl. No.: 65,668

[22] Filed: Jun. 24, 1987

Related U.S. Application Data

[63] Continuation of Ser. No. 907,169, Sep. 15, 1986, abandoned, which is a continuation of Ser. No. 823,837, Jan. 30, 1986, abandoned, which is a continuation of Ser. No. 498,563, May 26, 1983, abandoned.

[30] Foreign Application Priority Data

May 26, 1982 [JP] Japan .................. 57-089411

[51] Int. Cl.[4] .............................................. H05K 7/10
[52] U.S. Cl. .................. 361/392; 174/52 FP; 361/395; 361/400; 361/401; 439/69
[58] Field of Search ............... 361/392, 393, 394, 395, 361/400, 401; 174/52 FP; 439/55, 69, 74, 71, 525

[56] References Cited

U.S. PATENT DOCUMENTS

| | | | |
|---|---|---|---|
| 3,479,634 | 11/1969 | Pritulsky | 339/176 M X |
| 3,846,734 | 11/1974 | Pauza et al. | 174/52 FP X |
| 4,035,046 | 7/1977 | Kloth | 174/52 FP X |
| 4,037,270 | 7/1977 | Ahmann et al. | 174/52 FP X |
| 4,155,615 | 5/1979 | Zimmerman et al. | 174/52 FP X |
| 4,271,426 | 6/1981 | Hargis | 439/69 X |
| 4,356,532 | 10/1982 | Donaher et al. | 174/52 FP X |
| 4,378,139 | 3/1983 | Griffin et al. | 339/17 C |
| 4,417,777 | 11/1983 | Bamford | 339/17 CF |
| 4,538,864 | 9/1985 | Ichimura | 339/17 CF |
| 4,558,397 | 12/1985 | Olsson | 439/69 X |
| 4,627,533 | 12/1986 | Pollard | 174/52 FP X |

Primary Examiner—R. R. Kucia
Attorney, Agent, or Firm—Staas & Halsey

[57] ABSTRACT

A semiconductor device module includes a package and a holder, the package includes, for example, a central processing unit, and the holder accommodates a removable leadless chip carrier. The holder comprising contact leads connected to electrode pads of the package. The leadless chip carrier also includes, for example, an erasable programmable read only memory, whereby the leadless chip carrier can be easily removed from the holder, resulting in easily writing into the erasable programmable read only memory or easy replacement of the leadless chip carrier.

10 Claims, 5 Drawing Sheets

SEMICONDUCTOR DEVICE MODULE

This is a continuation of co-pending application Ser. No. 907,169, filed on Sept. 15, 1986, now abandoned, which is a continuation of U.S. application Ser. No. 823,837, filed Jan. 30, 1986, now abandoned; and which is a continuation of U.S. application Ser. No. 498,563, filed May 26, 1983, now abandoned.

BACKGROUND OF THE INVENTION

1. Field of the Invention

The present invention relates to a semiconductor device, more particularly, to a semiconductor device module including a structure in which a package having an integrated circuit (IC) chip mounted thereon, for example, a central processing unit (CPU), is connected to a leadless chip carrier (LCC) having mounted thereon, for example, an erasable programmable read only memory (EPROM), by means of a box-type holder into which the LCC is fitted and can be removed. The LCC is one which does not have, at its surface, any lead projections.

2. Description of the Prior Art

It is known to combine a CPU and EPROM to form an evaluation one-chip microcomputer. A desired program is written into the EPROM by cyclically carrying out a writing operation an evaluating operation, and an erasing operation by means of ultraviolet rays. Once a desired program is obtained in the EPROM, mask read only memories (mask ROM's) having the desired program are manufactured simultaneously with the manufacturing of the CPU so as to form commercially-used one-chip microcomputers.

Usually, the evaluation one-chip microcomputer or the commercially-used one-chip microcomputer is mounted on a substrate on which other devices of, for example, a random access memory (RAM), are also mounted.

Conventionally, an EPROM, even one formed as an LCC, is mounted on a package by soldering its electrodes to the electrodes of the package. When an evaluation one-chip microcomputer is assembled with other devices on the same substrate, as mentioned above, it is difficult to carry out the writing operation, the evaluation operation or the erasing operation. That is, in order to write a new program into the EPROM, the EPROM must be removed from the package or the evaluation one-chip microcomputer must be replaced by a new evaluation one-chip microcomputer having an EPROM into which a new program has been written. Removal of an EPROM from a package is almost impossible, while replacement of a one-chip microcomputer is very expensive.

Further, in a conventional evaluation one-chip microcomputer, the package having the EPROM and the CPU mounted thereon is referred to as a dual-in-line package. The EPROM is mounted on a portion of the dual-in-line package different from the portion where the CPU is mounted. Therefore, the conventional evaluation one-chip microcomputer has the problem of being large in size.

More generally, in semiconductor devices, it is often required to be able to easily replace one of the elements in a device by another element. For example, when one of the elements in a semiconductor device is destroyed, a new element must be added to replace the destroyed element. Also, for example, in order to obtain various functions in one semiconductor device, one or more elements may be simply replaced by another element.

Conventionally, however, semiconductor elements such as CPUs, RAMs, or analog-to-digital (A/D) converters, are fixedly mounted by, for example, soldering them on the device and they cannot be removed easily.

SUMMARY OF THE INVENTION

An object of the present invention is to provide a holder for accommodating removable LCC.

Another object of the present invention is to provide a semiconductor device module having the above-mentioned holder for accommodating a removable LCC, the LCC being able to be easily removed from the holder.

Still another object of the present invention is to provide an evaluation one-chip microcomputer having an EPROM which can be easily removed from the one-chip microcomputer.

A still further object of the present invention is to provide the above-mentioned evaluation one-chip microcomputer in which debugging of the EPROM can be easily carried out.

To attain the above objects, there is provided a holder for accommodating an LCC including a plurality of electrode pads formed on the outer surface thereof. The holder comprises a holder body having a recessed portion for accommodating the LCC and having a plurality of contact leads adapted to contact with the electrode pads of the LCC. The contact leads are provided on the inner wall of the recessed portion. Each of the contact leads has an end exposed on the bottom surface of the holder body so as to form an electrode pad. The electrode pads of the holder body are connected to an external circuit.

Also, to attain the above objects, there is provided a semiconductor device module including a package and the above-mentioned holder. The package accommodates at least one semiconductor element of, for example, a CPU. The package includes a plurality of external terminals, a main surface, and a plurality of electrode pads provided on the main surface. The holder is mounted on the main surface of the package. The electrode pads of the holder body are connected to the electrode pads provided on the main surface of the package. The LCC is removably fitted in the recessed portion of the holder body.

BRIEF DESCRIPTION OF THE DRAWINGS

The above objects and features as well as other advantages and features of the present invention will be more apparent from the following description of a preferred embodiment when read in conjunction with the accompanying drawings, wherein.

DESCRIPTION OF THE PREFERRED EMBODIMENTS

Before describing the preferred embodiments of the present invention, a conventional one-chip microcomputer and its problem will be described with reference to FIG. 1.

Figure 1:
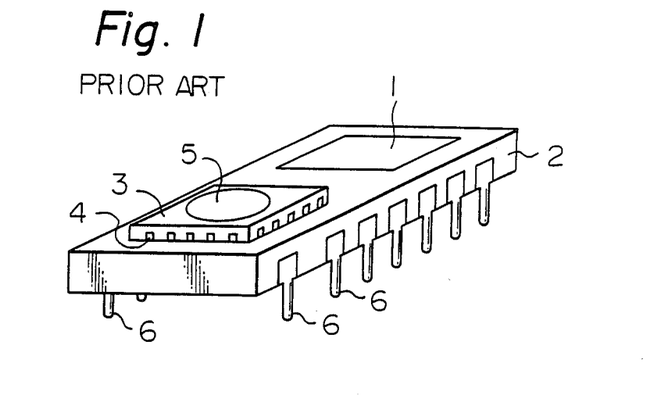
FIG. 1 is a perspective view of a conventional one-chip microcomputer.

In FIG. 1, a dual-inline package having an evaluation one-chip microcomputer mounted thereon, is illustrated, wherein, under a cap 1, a semiconductor chip including a CPU and a RAM are assembled in a ceramic package 2. On the ceramic package 2, an LCC 3 is mounted. The LCC 3 accommodates an EPROM. The LCC 3 has, on its outer surface, a plurality of electrode pads 4 and a window 5 for introducing ultraviolet rays. The electrode pads 4 exposed on the bottom surface of the LCC 3 are connected to electrode pads (not shown) exposed on the surface of the ceramic package 2 by soldering. Reference numerals 6 represent pins of the one-chip microcomputer.

When the evaluation one-chip microcomputer of FIG. 1 is used for obtaining a desired program, the EPROM mounted in the LCC 3 must be subjected to a writing operation, an evaluating operation for evaluating the stored program and an erasing operation for debugging the stored program. The writing operation is carried out by connecting an adapter, etc., to the electrode pads 4 and, then, applying a voltage pulse through the electrode pads 4 to a desired memory cell in the EPROM. This writing operation, however, must be carried out after the LCC 3 is removed from the package 2. If the LCC 3 is not removed from the package 2 during the writing operation, the voltage pulse applied from the adapter to the electrode pads 4 is unnecessarily applied to the electrode pads of the package 2 connected to the electrode pads 4 of the LCC 3, causing an undesired operation in the package 2. It is, however, very difficult to remove a soldered LCC 3 from the package 2. Accordingly, to obtain a desired program in the EPROM, conventionally, the one-chip microcomputer as a whole must be replaced by a new evaluation one-chip microcomputer. The cost of such a replacement is very high.

Figure 2:
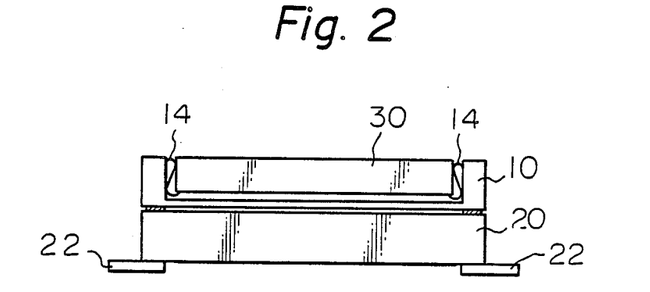
FIG. 2 is a cross-sectional view of a semiconductor device module according to an embodiment of the present invention.

Now, a preferred embodiment of the present invention will be described. FIG. 2 is a general cross-sectional view of a semiconductor device module according to an embodiment of the present invention. In FIG. 2, a holder 10 is fixed on a package 20 in such a manner that electrodes at the bottom of the holder 10 are connected to electrodes at the top of the package 20 by soldering. The holder 10 has a recessed portion and contact leads 14 for removably accommodating an LCC 30. The LCC 30 in this embodiment has an EPROM mounted therein. The package 20 in this embodiment is a flat package having a plurality of horizontally extending pins 22. The flat package 20 in this embodiment includes a CPU and a RAM (not shown in FIG. 2). Thus, the semiconductor device module in FIG. 2 functions as an evaluation one-chip microcomputer having pins 22. The pins 22 function in the same way as pins of a mass-produced one-chip microcomputer. Since the LCC 30 is removably accommodated in the recess portion of the holder 10, it is easy to write a new program into the EPROM after the LCC 30 is removed from the holder 10.

Figure 3:
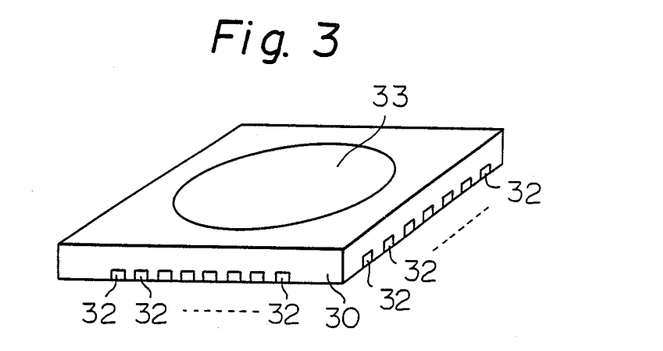
FIG. 3 is a perspective view of an LCC when removed from the module of FIG. 2.

FIG. 3 is a perspective view of the LCC 30 when it is removed from the module of FIG. 2. In FIG. 3, the LCC 30 itself is the same as the conventional LCC 3 of FIG. 1 and has, on its outer surface, a plurality of electrode pads 32 and, on its top surface, a window 33 for introducing ultraviolet rays. The LCC 30 has a square-shaped bottom surface. The length of each side of the bottom surface is about 11 mm, for example.

Figure 4:
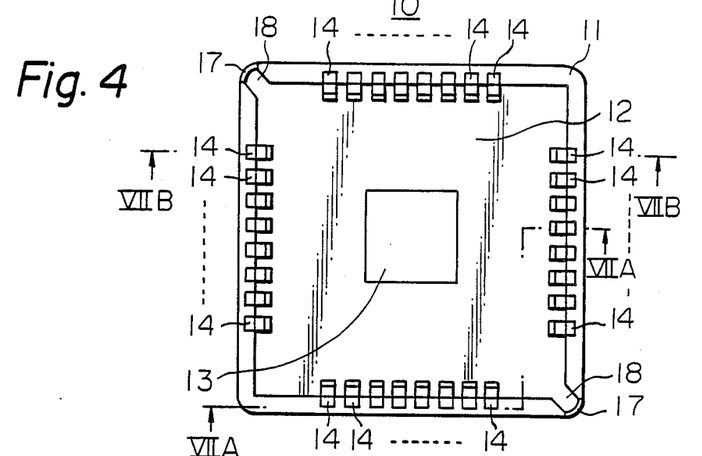
FIG. 4 is a top plan view of a holder for accommodating the LCC of FIG. 3, the holder being one component of the module of FIG. 2.
Figure 5:
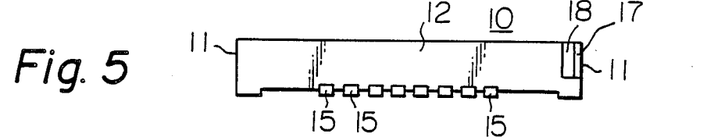
FIG. 5 is a side view of the holder of FIG. 4.
Figure 6:
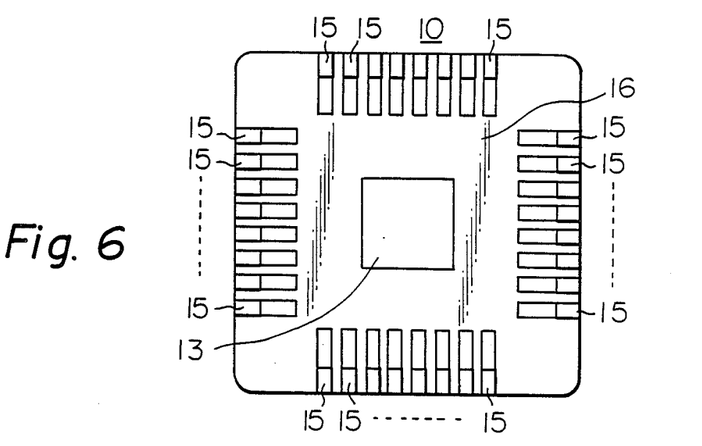
FIG. 6 is a bottom plan view of the holder of FIG. 4.

FIGS. 4, 5, and 6 are a top plan view, a side view, and a bottom plan view of the holder 10, respectively. Referring to FIGS. 4, 5, and 6, the holder 10 comprises a box-type holder body having a square-shaped bottom surface. The length of each side of the bottom surface is about 14 mm, for example. Reference numeral 11 is a side wall. Enclosed by the side wall 11, a recessed portion 12 for removably accommodating the LCC 30 is formed. At the center of the recessed portion 12 is a hole 13 for radiating heat. On the inner wall of the recessed portion 12, a plurality of contact leads 14 are provided. The contact leads 14 are adapted to contact the electrode pads 32 of the LCC 30 when the LCC 30 is accommodated in the recessed portion 12. Each of the contact leads 14 has an end 15 exposed on the bottom surface 16. Each end 15 forms an electrode pad for the holder 10 and the electrode pads 15 are soldered to electrode pads of the package 20, as described in detail later.

The holder 10, according to the present invention, does not have any horizontally-projecting lead pins as do conventional holders. Through the non-projecting electrode pads 15 exposed on the bottom surface of the holder 10, any other device may be connected. Accordingly, the advantage of the LCC 30 is that the LCC 30 can be mounted on any semiconductor device with a high density, and the density is not deteriorated even when the holder 10 is employed. Only the holder 10 described above can realize the semiconductor device module according to the present invention.

As can be seen from FIGS. 4 and 5, at the two corners of the holder 10 on one diagonal line of the side wall 11 when viewed from the top of the holder 10, there are cut portions 17 and 18 provided in the side wall 11. These cut portions 17 and 18 make it easy to remove the LCC 30 from the recessed portion 12 by means of a tool, for example, pincers.

Figure 7A:
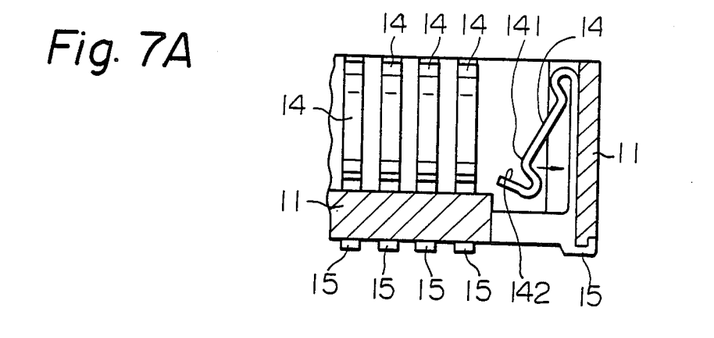
FIG. 7A is a partially expanded cross-sectional view taken along line VIIA—VIIA of FIG. 4, when the holder does not accommodate the LCC.

FIG. 7A is a partially expanded cross-sectional view taken along the line VIIA—VIIA of FIG. 4, when the holder 10 does not accommodate the LCC 30. Referring to FIG. 7A, each contact lead 14 has a spring means with contact portions 141 and 142, so that when the LCC 30 is inserted into the recessed portion 12, each of the contact leads 14 is pressed by the electrode pads 32 in the direction of the arrow, making sure that the electrode pads 32 are electrically in contact with the contact portions 141 and 142.

Figure 7B:
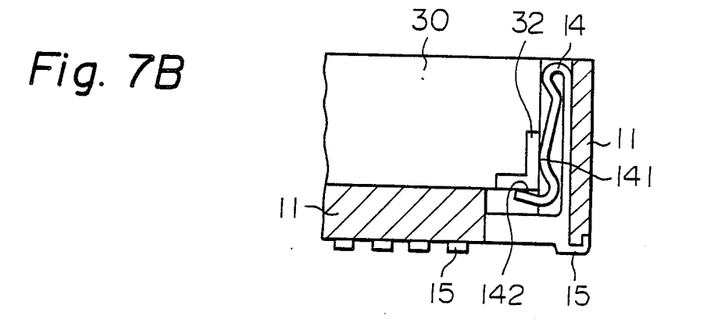
FIG. 7B is a partially expanded cross-sectional view of the embodiment taken along line VIIB—VIIB of FIG. 4, when the holder accommodates the LCC.

FIG. 7B is the part of the cross-sectional view of the holder 10 when the LCC 30 is accommodated in the recessed portion of the holder 10. In FIG. 7B, the contact portions 141 and 142 are in contact with the electrode pad 32. The shape of the contact leads 14 is not restricted to the shape illustrated in FIG. 7A.

Figure 7C:
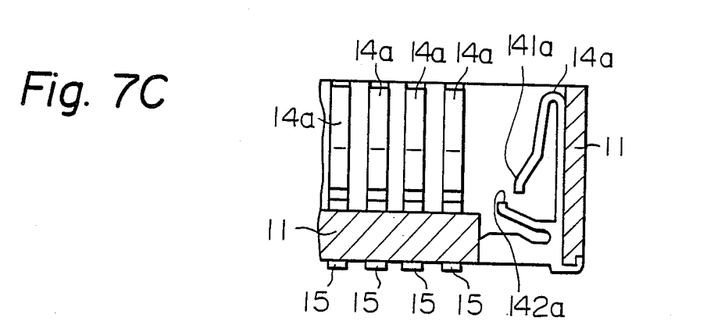
FIG. 7C is a cross-sectional view of a modified embodiment of a holder.

FIG. 7C is another example of contact leads 14a having contact portions 141a and 142a which ensure electrical contact between the electrode pads 32 and the contact leads 14a.

Figure 8:
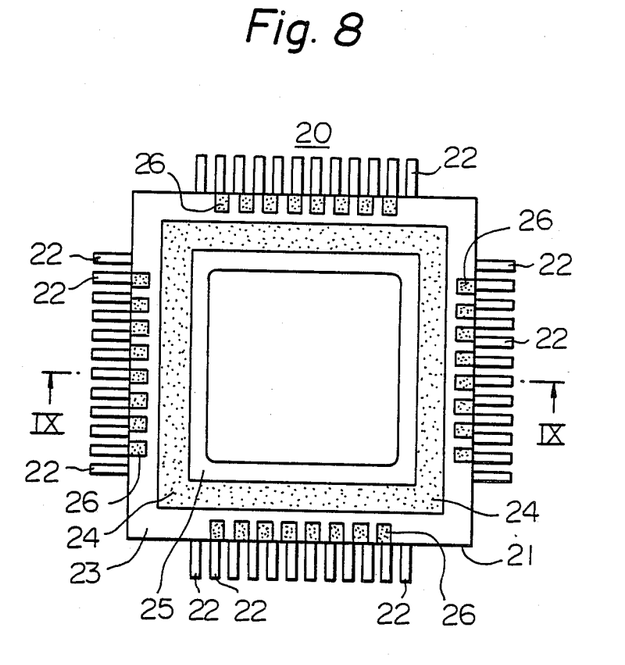
FIG. 8 is a top plan view of a package on which the holder of FIG. 4 is to be mounted.

FIG. 8 is a top plan view of the package 20. In FIG. 8, the package 20 comprises a flat package body 21 and a plurality of horizontally extending pins 22 provided on the bottom surface of the flat package body 21. The flat package body 21 has a square-shaped main surface. On the main surface, there is provided a contact region 23 on the outermost portion of the main surface, a cap-covering region 24 on the inner portion of the contact region 23, and an inner-lead region 25 on the inner portion of the cap-covering region 24.

Figure 9:
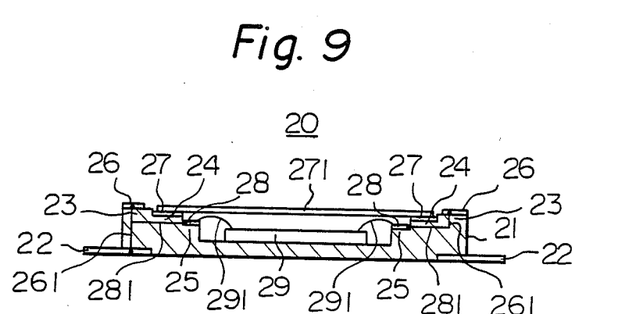
FIG. 9 is a cross-sectional view taken along line IX—IX of FIG. 8.

FIG. 9 is a cross-sectional view taken along line IX—IX of FIG. 8. As can be seen from FIGS. 8 and 9, the contact region 23, the cap-covering region 24, and the inner-lead region 25 form a top stair, a middle stair, and a bottom stair, respectively. On the contact region 23, there are provided a plurality of electrode pads 26 which are electrically contacted by soldering the ends 15 of the contact leads 14, respectively, when the holder 10 is mounted on the package 20. On the cap-covering region 24, a metal plate 27 is covered. A square-shaped cap 271 is fixed on the metal plate 27. On the inner-lead region 25, a plurality of inner leads 28 are provided. At the center of the flat package body 21 is a cavity for accommodating a semiconductor chip 29 which includes a CPU and a RAM. The pad (not shown) of the semiconductor chip 29 are connected to the inner leads 28 by wires 291. Some of the inner leads 28 are connected to the electrode pads 26 through wiring layers 281 and through holes 261 in the flat package body 21. The rest of the inner leads 28 are connected to the pins 22 through the through holes 261 in the flat package body 21. Therefore, each inner lead 28 is connected to either an electrode pad 26 or a pin 22. The flat package body 21 has several laminated ceramic layers. Between the laminated ceramic layers, the above-mentioned wiring layers are formed.

The LCC shown in FIG. 3, the holder 10 shown in FIGS. 4 through 7, and the package 20 shown in FIGS. 8 and 9 are combined to form the evaluation one-chip microcomputer module shown in FIG. 2.

It will be apparent that, in this embodiment, since the holder 10 is provided, the LCC 30 can easily be removed from the holder. Therefore, an erasing operation and rewriting operation can easily be carried out on the same EPROM. As a result, a desired program can be obtained at a low cost.

Figure 10:
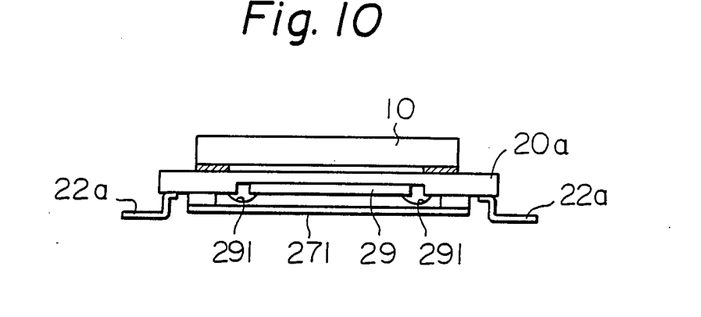
FIG. 10 is a cross-sectional view of a semiconductor device module according to another embodiment of the present invention.

FIG. 10 is a general cross-sectional view of a semiconductor device module according to another embodiment of the present invention. In FIG. 10, a package 20a has an upside down configuration in comparison with the package 20 of FIG. 9. That is, the semiconductor chip 29 is fixed in a recessed portion formed, not in the top surface, but in the bottom surface of the package 20a. The holder 10 is mounted on the top surface of the package 20a by soldering. Reference character 22a represents pins of the package 20a. Reference numerals 271 and 291 represent the cap and the wire, respectively, as in FIG. 9.

Figure 11:
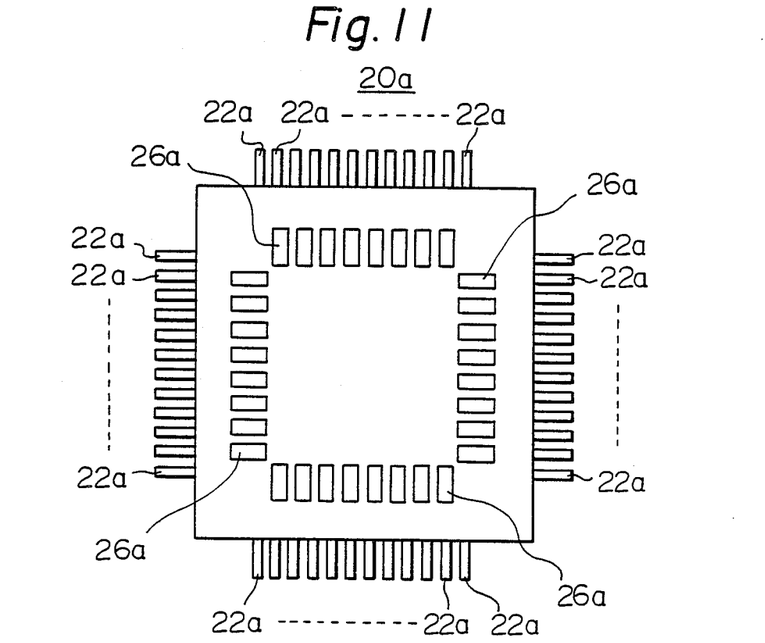
FIG. 11 is a top plan view of the package in the module of FIG. 10.

FIG. 11 is a top plan view of the package 20a. In FIG. 11, a plurality of electrode pads 26a are provided on the top surface of the package 20a. These electrode pads 26a are adapted to electrically contact, by soldering, the ends 15 of the contact leads 14 of the holder 10. It should be noted that, unlike the top surface of the package 20, the top surface of the package 20a in this embodiment is flat and does not have the stair shape as illustrated in FIG. 9. Therefore, the top surface of the package 20a can be freely used. Accordingly, various sizes of holders can be mounted on the package 20a.

The present invention is not restricted to the above-described embodiments. Various changes and modifications are possible without departing from the spirit of the present invention. For example, instead of employing a square-shaped flat package body and a holder having a square-bottom surface, rectangular shapes are also possible. Further, instead of employing a flat package, a dual-inline package is also possible. Still further, in addition to an evaluation one-chip microcomputer, the present invention can be effectively applied to many other semiconductor devices when semiconductor elements in the device are replaced.

From the foregoing description, it will be apparent that, according to the present invention, since a holder for removably accommodating an LCC is obtained and since a semiconductor device module comprising the holder is obtained, an LCC can easily be removed from the semiconductor device module. Thus, when an LCC includes an EPROM, the EPROM can easily be rewritten at a low cost or the LCC can easily be replaced by another LCC at a low cost.

We claim:

1. A semiconductor device module including internal wiring layers, operatively connected to an external circuit, including a leadless chip carrier having side surfaces, said semiconductor device module comprising:

at least one semiconductor chip;

a package accommodating said semiconductor chip, said package including a main surface, perpendicular to the side surfaces of the leadless chip carrier, a bottom surface opposite said main surface, a plurality of external terminals formed on said bottom surface, and a plurality of first electrode pads provided on said periphery of said main surface and extending in a direction parallel to said main surface;

a holder, mounted on said main surface of said package and having substantially the same or smaller external shape and size as that of said package, for accommodating the leadless chip carrier, the leadless chip carrier including a plurality of second electrode pads formed on its side surfaces, said holder including a holder body having external surfaces, having a bottom surface adjacent to said main surface of said package and having a recessed portion formed therein for accommodating the leadless chip carrier, said recessed portion having inner walls adjacent to the leadless chip carrier; and a plurality of contact leads operatively connected to said second electrode pads of said leadless chip carrier and provided on the inner walls of said recessed portion adjacent to the side surfaces of said leadless chip carrier, each of said contact leads having an end exposed on the bottom surface of said holder body and extending in a direction parallel to the bottom surface so as to respectively form third electrode pads operatively connected to said first electrode pads, each of said third electrode pads positioned on the interior of said external surfaces of said holder body and including contact portions extending in a direction parallel to the bottom surface of said holder body and abutting said external surfaces of said holder body, for contacting the external circuit, said leadless chip carrier being removably fitted in said recessed portion of said holder body, and said first electrode pads operatively connected to said at least one semiconductor chip through the internal wiring layers.

2. A semiconductor device module as set forth in claim 1, wherein said leadless chip carrier includes an erasable programmable read only memory.

3. A semiconductor device module as set forth in claim 1, wherein said holder has a square-shaped bottom surface.

4. A semiconductor device module as set forth in claim 3, wherein said main surface of said package is a square surface having the same area as the square surface of said square-shaped bottom surface of said holder.

5. A semiconductor device module as set forth in claim 2, wherein said semiconductor chip accommodated in said package is a microcomputer chip.

6. A semiconductor device module as set forth in claim 1, wherein said inner walls of said recessed portion in said holder include a side wall perpendicular to the bottom surface of the holder.

7. A semiconductor device module as set forth in claim 6, wherein said side wall is provided with at least one cut portion on a diagonal line of said side wall, for removing said leadless chip carrier by means of a tool.

8. A semiconductor device module as set forth in claim 1, wherein each of said contact leads of said holder includes spring means for ensuring electrical contact between said second electrode pads of said leadless chip carrier and said contact leads of said holder.

9. A semiconductor device module as set forth in claim 1, wherein said package is a flat package.

10. A semiconductor device module as set forth in claim 1, wherein said package is a dual inline package.

* * * * *

UNITED STATES PATENT AND TRADEMARK OFFICE
CERTIFICATE OF CORRECTION

PATENT NO.   : 4,737,884
DATED        : APRIL 12, 1988
INVENTOR(S)  : KENSAKU WADA ET AL.

It is certified that error appears in the above-identified patent and that said Letters Patent is hereby corrected as shown below:

FRONT PAGE [57] ABSTRACT, line 5, "of" should be --on--.

Col. 2, line 11, after "accommodating" insert --a--.

Col. 5, line 49, "LCC" should be --LCC 30--.

Signed and Sealed this

Sixteenth Day of August, 1988

Attest:

DONALD J. QUIGG

*Attesting Officer*            *Commissioner of Patents and Trademarks*